United States Patent [19]

Lien

[11] Patent Number: 5,086,365
[45] Date of Patent: Feb. 4, 1992

[54] ELECTOSTATIC DISCHARGE PROTECTION CIRCUIT

[75] Inventor: Cheun-Der Lien, Mountain View, Calif.

[73] Assignee: Integrated Device Technology, Inc., Santa Clara, Calif.

[21] Appl. No.: 521,148

[22] Filed: May 8, 1990

[51] Int. Cl.$^5$ .............................................. H02H 3/24
[52] U.S. Cl. ........................................ 361/58; 361/56; 361/90; 361/86; 361/111; 357/23.13
[58] Field of Search .................... 361/58, 56, 111, 91, 361/58, 56, 90, 91, 111; 357/23.12

[56] References Cited

U.S. PATENT DOCUMENTS 3,746,946 7/1973 Clark ..................................... 361/91
4,385,337 5/1983 Asano et al. ........................... 361/59

Primary Examiner—A. D. Pellinen
Assistant Examiner—S. W. Jackson
Attorney, Agent, or Firm—Thomas E. Schatzel

[57] ABSTRACT

For electrostatic-discharge-protection, a first transistor is configured with the transistor channel connected between circuit ground and an associated (input or output) pad. In addition, transistors(s) are included configured to "float" the gate and/or the well of the first transistor when no power supply potential (Vcc) is present and to couple to circuit ground (or the power supply potential) the gate and/or the well of the first transistor when the normal power supply potential (Vcc) is present.

9 Claims, 1 Drawing Sheet

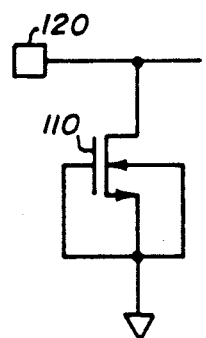
Fig_1 (PRIOR ART)
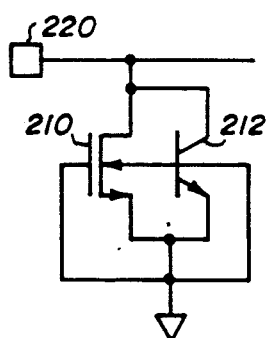
Fig_2 (PRIOR ART)
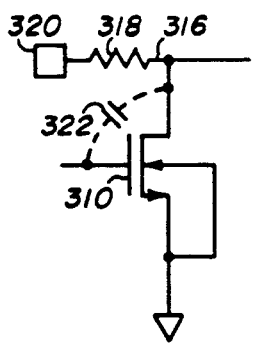
Fig_3A
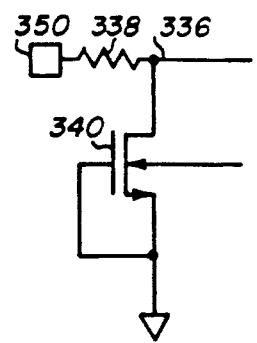
Fig_3B
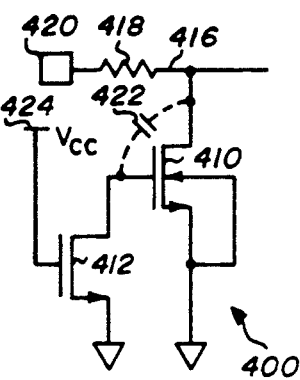
Fig_4A
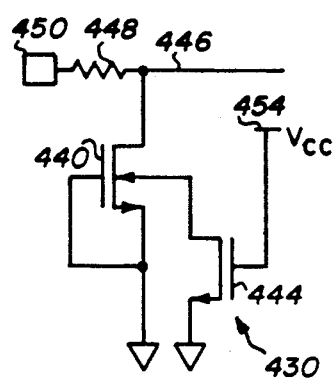
Fig_4B
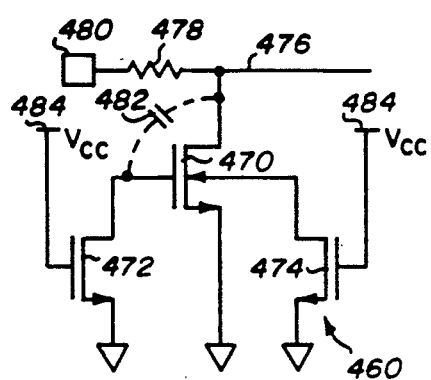
Fig_4C
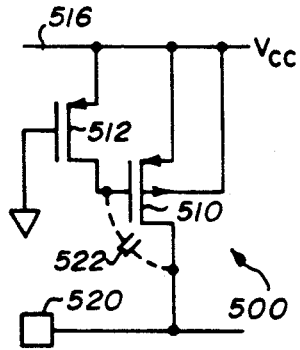
Fig_5A
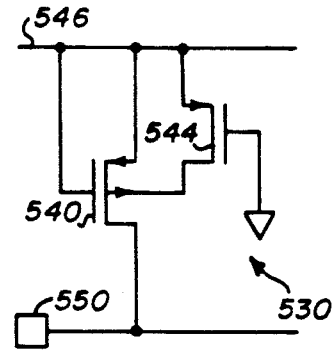
Fig_5B
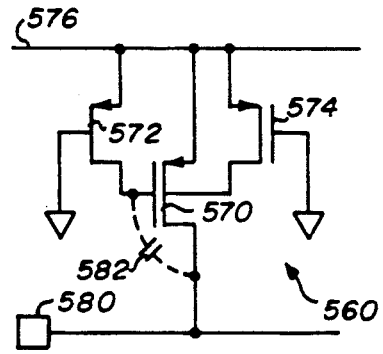
Fig_5C
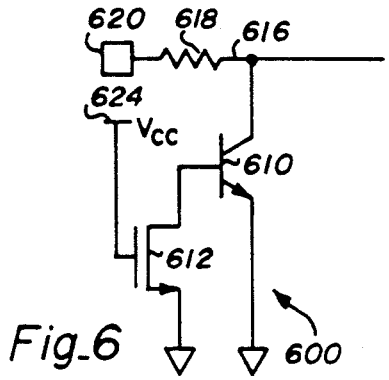
Fig_6
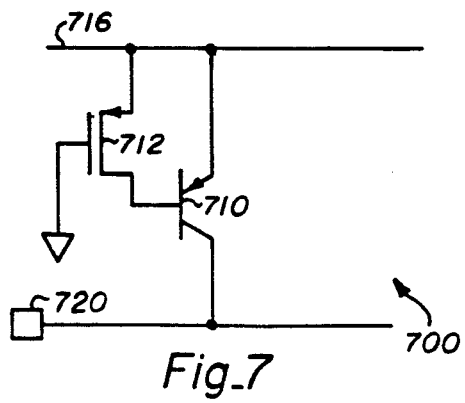
Fig_7

ELECTROSTATIC DISCHARGE PROTECTION CIRCUIT

TECHNICAL FIELD

The present invention relates to integrated circuits generally and more particularly to means for protecting such circuits from electrostatic discharge.

BACKGROUND ART

Integrated circuits (ICs) generally and particularly those employing metal-oxide-semiconductor (MOS) type field-effect transistors (FETs) are susceptible to damage during handling from the discharge of static electricity (electrostatic discharge). To protect a metal-oxide-semiconductor-type integrated circuit from damage from electrostatic discharge (ESD), common practice is to connect the input and/or output pads of the integrated circuit each to an associated (internal) electrostatic-discharge-protection device (circuit).

Ideally, an electrostatic-discharge-protection device (circuit) 1) should not leak charge, 2) should not capacitively load the associated pad (by more than one picofarad), and 3) should, responsive to an electrostatic-discharge pulse, clamp the level of the voltage developed between the pad and circuit ground to a voltage level (less than 15 volts) low enough to protect devices connected to the pad while discharging the static charge. Further, ideally, an electrostatic-discharge-protection circuit 4) should conduct the an electrostatic discharge in a uniform flow. A uniform charge flow minimizes the required size of the electrostatic-discharge-protection device and minimizes local heating of the device which can cause secondary breakdown, locally damaging the device.

Typical of prior-art-type electrostatic-discharge-protection devices (circuits) is the device (transistor) which is illustrated in FIG. 1 of the drawing generally designated by the number 110. Device 110 is configured as a gated diode with the device gate, well, and source connected to circuit ground and with the device drain connected to the associated (input or output) pad, which is designated in the drawing by the number 120. When so configured, device 110 functions as illustrated in FIG. 2. Specifically, device 110 (shown in FIG. 1) functions as the combination of a gate grounded N-channel-type metal-oxide-semiconductor (N-MOS) transistor (designated 210 in FIG. 2) connected in parallel with a base-grounded lateral NPN bipolar transistor (designated 212 in FIG. 2).

Fortunately, device (circuit) 110 (shown in FIG. 1) is particularly useful in protecting the associated integrated circuit from negative electrostatic-discharge pulses (pulses of the type in which the associated pad is driven to a negative potential with respect to circuit ground). Specifically, responsive to a negative electrostatic-discharge pulse, both the N-channel transistor (designated 210 in FIG. 2) and the bipolar transistor (designated 212 in FIG. 2) are turned on. The transistors conduct a uniform level of current and develop a low voltage drop across the device (gated diode).

Unfortunately, device (circuit) 110 (shown in FIG. 1) is not particularly useful in protecting the associated integrated circuit from positive electrostatic-discharge pulses (pulses of the type in which the associated pad is driven to a positive potential with respect to circuit ground). Specifically, responsive to a positive electrostatic-discharge pulse, the gated diode (device 110) breaks down with a non-uniform charge flow and develops across the diode (device 110) a relatively high voltage drop.

In the U.S. Pat. No. 3,746,946 of Lowell Clark and the U.S. Pat. No. 3,777,216 of William Armstrong, to protect a (first) insulated gate field effect transistor, a second insulated gate field effect transistor is included, configured with the transistor channel connected between the gate of the first transistor and circuit ground. In the U.S. Pat. No. 3,746,946 of Lowell Clark, the gate of the second transistor is connected to a power supply potential (Vdd). In the U.S. Pat. No. 3,777,216 of William Armstrong, the gate of the second transistor is connected to the anode of a diode, the cathode of which is connected to circuit ground.

SUMMARY OF THE INVENTION

It is therefore the primary object of the present invention to provide an electrostatic-discharge-protection circuit which 1) does not leak charge, 2) does not capacitively load an associated pad, and, 3) responsive to an electrostatic-discharge pulse, clamps the level of the voltage developed between the pad and circuit ground to a voltage level low enough to protect devices connected to the pad while discharging the static charge.

Another object of the present invention is to provide an electrostatic-discharge-protection circuit which conducts the charge from an electrostatic-discharge pulse in a uniform flow.

Briefly, the presently preferred embodiment of an electrostatic-discharge-protection circuit in accordance with the present invention includes a first transistor configured with the transistor channel connected between circuit ground and the associated (input or output) pad. In addition, the circuit includes transistor(s) configured to "float" the well and/or the gate of the first transistor when no power supply potential (Vcc) is present and to couple to circuit ground (or the power supply potential) the well and/or the gate of the first transistor when the normal power supply potential (Vcc) is present.

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a schematic diagram of a prior-art-type electrostatic-discharge-protection device (circuit);

FIG. 2 is a schematic diagram representing functionally the electrostatic-discharge-protection device (circuit) shown in FIG. 1;

FIGS. 3A and 3B are schematic diagrams of electrostatic-discharge-protection devices (circuits) in accordance with the present invention;

FIGS. 4A-4C are schematic diagrams of presently preferred embodiments of electrostatic-discharge-protection circuits in accordance with the present invention for N-channel-type metal-oxide-semiconductor integrated circuits;

FIGS. 5A-5C are schematic diagrams of presently preferred embodiments of electrostatic-discharge-protection circuits in accordance with the present invention for P-channel-type metal-oxide-semiconductor integrated circuits;

FIG. 6 is a schematic diagram of the presently preferred embodiment of a PNP-transistor-type electrostatic-discharge-protection circuit in accordance with the present invention; and FIG. 7 is a schematic diagram of the presently preferred embodiment of an NPN-transistor-type electrostatic-discharge-protection circuit in accordance with the present invention.

DETAILED DESCRIPTION OF THE PREFERRED EMBODIMENT

Illustrated in FIG. 3A of the drawing generally designated by the number 310 is an electrostatic-discharge-protection device (circuit) in accordance with the present invention. Device (transistor) 310 is configured with the transistor channel connected between circuit ground and a line 316, which is coupled by a resistor 318 to the associated (input or output) pad, which is designated in the drawing by the number 320. In other words, device 310 is configured with the transistor source connected to circuit ground and with the transistor drain coupled by resistor 318 to pad 320. Also, device 310 is configured with the transistor well connected to circuit ground. The gate of device (transistor) 310 is not connected (left floating). In addition, an intentionally introduced or parasitic gate to drain capacitor is included, represented in FIG. 3A by a capacitor 318. When so configured, capacitor 322 couples to the gate of device (transistor) 310 positive electrostatic-discharge pulses (pulses of the type in which pad 320 is driven to a positive potential with respect to circuit ground). As a consequence, each of the positive electrostatic-discharge pulses turns on the N-channel transistor portion of the equivalent circuit of device 310 (see transistor 210 in FIG. 2) insuring a (more) uniform charge flow (then with no device or with device 110, shown in FIG. 1). (Resistor 318 is not part of the electrostatic-discharge-protection circuit. Rather, resistor 318 is employed to limit the current during periods when the pad (320) is reversed biased to protect other integrated circuit components. Typically, resistor 318 has a process dependent resistance of from 100 to 500 ohms.)

In another embodiment, illustrated in FIG. 3B of the drawing generally designated by the number 340, is another electrostatic-discharge-protection device (circuit) in accordance with the present invention. Device (transistor) 340 is configured with the transistor gate and source connected to circuit ground and with the transistor drain connected to a line 336, which is coupled by a resistor 338 to the associated (input or output) pad, which is designated 350. The well of device (transistor) 340 is not connected (left floating). When so configured, each positive electrostatic-discharge pulse turns on the bipolar transistor portion of the equivalent circuit of device 340 (see transistor 212 in FIG. 2) insuring a (more) uniform charge flow.

Unfortunately, however, during normal operation of the associated integrated circuit (IC), the above mentioned electrostatic-discharge-protection devices (device 310, shown in FIG. 3A, and device 340, shown in FIG. 3B) have a relatively high level of charge leakage.

Illustrated in FIG. 4A of the drawing generally designated by the number 400 is a presently preferred embodiment of an electrostatic-discharge-protection circuit in accordance with the present invention. Circuit 400 includes a pair of N-channel-type metal-oxide-semiconductor (N-MOS) transistors, which are respectively designated 410 and 412. Transistor 410 is configured with the transistor well and source connected to circuit ground and with the transistor drain connected to a line 416, which is coupled by a resistor 418 to the associated (input or output) pad, which is designated 420. In addition, an intentionally introduced or parasitic gate to drain capacitor is included, represented in FIG. 4A by a capacitor 422, which is connected between the gate and drain of transistor 410. Transistor 412 is configured with the transistor source connected to circuit ground and with the transistor drain connected to the gate of transistor 410. The gate of transistor 412 is connected to a (positive) power supply potential line (Vcc), which is designated 424, to receive the power supply potential when the associated integrated circuit (IC) is powered. When so configured, absent a power supply potential (Vcc), circuit 400 functions as though the gate of transistor 410 were not connected (left floating). As a consequence, each of the positive electrostatic-discharge pulses turns on the N-channel transistor portion of the equivalent circuit of transistor 410 (see transistor 210 in FIG. 2) insuring a (more) uniform charge flow. When a power supply potential (Vcc) is present, transistor 412 couples the gate of transistor 410 to circuit ground, minimizing the level of charge leakage.

In FIG. 4B of the drawing generally designated by the number 430 is illustrated another presently preferred embodiment of an electrostatic-discharge-protection circuit in accordance with the present invention. Circuit 430 includes a pair of N-channel-type metal-oxide-semiconductor transistors, which are respectively designated 440 and 444. Transistor 440 is configured with the transistor gate and source connected to circuit ground and with the transistor drain connected to a line 446, which is coupled by a resistor 448 to the associated (input or output) pad, which is designated 450. Transistor 444 is configured with the transistor source connected to circuit ground and with the transistor drain connected to the well of transistor 440. The gate of transistor 444 is connected to a (positive) power supply potential line (Vcc), which is designated 454, to receive the power supply potential when the associated integrated circuit (IC) is powered. When so configured, absent a power supply potential (Vcc), circuit 430 functions as though the well of transistor 440 were not connected. As a consequence, each of the positive electrostatic-discharge pulses turns on the bipolar transistor portion of the equivalent circuit of transistor 440 (see transistor 212 in FIG. 2) insuring a (more) uniform charge flow. When a power supply potential (Vcc) is present, transistor 444 couples the well of transistor 440 to circuit ground, minimizing the level of charge leakage.

Illustrated in FIG. 4C of the drawing generally designated by the number 460 is yet another presently preferred embodiment of an electrostatic-discharge-protection circuit in accordance with the present invention. Circuit 460 includes three N-channel-type metal-oxide-semiconductor transistors, which are respectively designated 470, 472, and 474. Transistor 470 is configured with the transistor source connected to circuit ground and with the transistor drain connected to a line 476, which is coupled by a resistor 478 to the associated (input or output) pad, which is designated 480. In addition, an intentionally introduced or parasitic gate to drain capacitor is included, represented in FIG. 4C by a capacitor 482, which is connected between the gate and drain of transistor 470. Transistor 472 is configured with the transistor source connected to circuit ground and with the transistor drain connected to the gate of transistor 470. The gate of transistor 472 is connected to a (positive) power supply potential line (Vcc), which is designated 484, to receive the power supply potential when the associated integrated circuit (IC) is powered. Transistor 474 is configured with the transistor source connected to circuit ground and with the transistor drain connected to the well of transistor 470. The gate of transistor 474 is connected to line 484, to, also, receive the power supply potential when the associated integrated circuit (IC) is powered. When so configured, absent a power supply potential (Vcc), circuit 460 functions as though the gate and well of transistor 470 were not connected. As a consequence, each of the positive electrostatic-discharge pulses turns on both the N-channel transistor portion and the bipolar transistor portion of the equivalent circuit of transistor 470 (see transistors 210 and 212 in FIG. 2) insuring a (more) uniform charge flow. When a power supply potential (Vcc) is present, transistor 472 couples the gate of transistor 470 to circuit ground; and, transistor 474 couples the well of transistor 470 to circuit ground, minimizing the level of charge leakage.

For P-MOS technology, illustrated in FIG. 5A of the drawing generally designated by the number 500 is a presently preferred embodiment of an electrostatic-discharge-protection circuit in accordance with the present invention. Circuit 500 includes a pair of P-channel-type metal-oxide-semiconductor (P-MOS) transistors, which are respectively designated 510 and 512. Transistor 510 is configured with the transistor channel connected between a (positive) power supply potential line (Vcc), which is designated 516, and the associated (input or output) pad, which is designated 520. In other words, transistor 510 is configured with the transistor source connected to line 516 and the transistor drain connected to pad 520. Also, transistor 510 is configured with the transistor well connected to line 516, to receive the power supply potential when the associated integrated circuit (IC) is powered. In addition, an intentionally introduced or parasitic gate to drain capacitor is included, represented in FIG. 5A by a capacitor 522, which is connected between the gate and drain of transistor 510. Transistor 512 is configured with the transistor gate connected to circuit ground, with the transistor source connected to line 516, and with the transistor drain connected to the gate of transistor 510.

In FIG. 5B of the drawing generally designated by the number 530 is illustrated another presently preferred embodiment of an electrostatic-discharge-protection circuit in accordance with the present invention. Circuit 530 includes a pair of P-channel-type metal-oxide-semiconductor transistors, which are respectively designated 540 and 544. Transistor 540 is configured with the transistor gate and source connected to a (positive) power supply potential line (Vcc), which is designated 546, to receive the power supply potential when the associated integrated circuit (IC) is powered. The drain of transistor 540 is connected to the associated (input or output) pad, which is designated 550. Transistor 544 is configured with the transistor gate connected to circuit ground, with the transistor source connected to line 546, and with the transistor drain connected to the gate of transistor 540.

Illustrated in FIG. 5C of the drawing generally designated by the number 560 is yet another presently preferred embodiment of an electrostatic-discharge-protection circuit in accordance with the present invention. Circuit 560 includes three P-channel-type metal-oxide-semiconductor transistors, which are respectively designated 570, 572, and 574. Transistor 570 is configured with the transistor source connected to a (positive) power supply potential line (Vcc), which is designated 576, to receive the power supply potential when the associated integrated circuit (IC) is powered. The drain of transistor 570 is connected to the associated (input or output) pad, which is designated 580. In addition, an intentionally introduced or parasitic gate to drain capacitor is included, represented in FIG. 5C by a capacitor 582, which is connected between the gate and drain of transistor 570. Transistor 572 is configured with the transistor gate connected to circuit ground, with the transistor source connected to line 576, and with the transistor drain connected to the gate of transistor 570. Transistor 574 is configured with the transistor gate connected to circuit ground, with the transistor source connected to line 576, and with the transistor drain connected to the gate of transistor 570.

The presently preferred embodiment of a PNP-transistor-type electrostatic-discharge-protection circuit in accordance with the present invention is illustrated in FIG. 6 of the drawing generally designated by the number 600. Circuit 600 includes a NPN-type bipolar transistor 610 and a N-channel-type metal-oxide-semiconductor transistor 612. Transistor 610 is configured with the transistor emitter connected to circuit ground and with the transistor collector connected to a line 616, which is coupled by a resistor 618 to the associated (input or output) pad, which is designated 620. Transistor 612 is configured with the transistor source connected to circuit ground and with the transistor drain connected to the base of transistor 610. The gate of transistor 612 is connected to a (positive) power supply potential line (Vcc), which is designated 624, to receive the power supply potential when the associated integrated circuit (IC) is powered.

Finally, the presently preferred embodiment of a PNP-transistor-type electrostatic-discharge-protection circuit in accordance with the present invention is illustrated in FIG. 7 of the drawing generally designated by the number 700. Circuit 700 includes a PNP-type bipolar transistor 710 and a P-channel-type metal-oxide-semiconductor transistor 712. Transistor 710 is configured with the transistor emitter connected to a (positive) power supply potential line (Vcc), which is designated 716, to receive the power supply potential when the associated integrated circuit (IC) is powered. The collector of transistor 710 is connected to the associated (input or output) pad, which is designated 720. Transistor 712 is configured with the transistor gate connected to circuit ground, with the transistor source connected to line 716, and with the transistor drain connected to the base of transistor 710.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. An electrostatic-discharge-protection circuit (430) for protecting an integrated circuit, the protection circuit comprising in combination:

an integrated circuit pad (450);

an integrated circuit power supply line (454);

a first N-channel-type metal-oxide-semiconductor transistor (440) having a transistor gate connected to circuit ground, a transistor well, and a transistor channel coupled between circuit ground and said pad (450); and a second N-channel-type metal-oxide-semiconductor transistor (444) having a transistor gate connected to said line (454) and a transistor channel connected between circuit ground and said first transistor (440) well.

2. An electrostatic-discharge-protection circuit (460) for protecting an integrated circuit, the protection circuit comprising in combination:

an integrated circuit pad (480);

an integrated circuit power supply line (484);

a first N-channel-type metal-oxide-semiconductor transistor (470) having a transistor gate, a transistor well, and a transistor channel including a first end connected to circuit ground and a second end coupled to said pad (480);

a second N-channel-type metal-oxide-semiconductor transistor (472) having a transistor gate connected to said line (484) and a transistor channel connected between circuit ground and said first transistor (470) gate; and a third N-channel-type metal-oxide-semiconductor transistor (474) having a transistor gate connected to said line (484) and a transistor channel connected between circuit ground and said first transistor (470) well.

3. An electrostatic-discharge-protection circuit (460) as recited in claim 2 wherein said first transistor (470) further has a capacitor (482) connected between said first transistor channel second end and said first transistor gate.

4. An electrostatic-discharge-protection circuit (500) for protecting an integrated circuit, the protection circuit comprising in combination:

an integrated circuit pad (520);

an integrated circuit power supply line (516);

a first P-channel-type metal-oxide-semiconductor transistor (510) having a transistor gate, a transistor well connected to line line (516), a transistor channel including a first end connected to said line (516) and a second end coupled to said pad (520), and a capacitor (522) connected between said first transistor channel second end and said first transistor gate; and a second P-channel-type metal-oxide-semiconductor transistor (512) having a transistor gate connected to circuit ground and a transistor channel connected between said line (516) and said first transistor (510) gate.

5. An electrostatic-discharge-protection circuit (530) for protecting an integrated circuit, the protection circuit comprising in combination:

an integrated circuit pad (550);

an integrated circuit power supply line (546);

a first P-channel-type metal-oxide-semiconductor transistor (540) having a transistor gate connected to line line (546), a transistor well, and a transistor channel coupled between said line (546) and said pad (550); and a second P-channel-type metal-oxide-semiconductor transistor (544) having a transistor gate connected to circuit ground and a transistor channel connected between said line (546) and said first transistor (540) well.

6. An electrostatic-discharge-protection circuit (560) for protecting an integrated circuit, the protection circuit comprising in combination:

an integrated circuit pad (580);

an integrated circuit power supply line (576);

a first P-channel-type metal-oxide-semiconductor transistor (570) having a transistor gate, a transistor well, and a transistor channel having a first end connected to said line (576) and a second end coupled to said pad (580);

a second P-channel-type metal-oxide-semiconductor transistor (572) having a transistor gate connected to circuit ground and a transistor channel connected between said line (576) and said first transistor (570) gate; and a third P-channel-type metal-oxide-semiconductor transistor (574) having a transistor gate connected to circuit ground and a transistor channel connected between said line (576) and said first transistor (570) well.

7. An electrostatic-discharge-protection circuit (560) as recited in claim 6 wherein said first transistor (570) further has a capacitor (582) connected between said first transistor channel second end and said first transistor gate.

8. An electrostatic-discharge-protection circuit (600) for protecting an integrated circuit, the protection circuit comprising in combination:

an integrated circuit pad (620);

an integrated circuit power supply line (624);

a first NPN-type bipolar transistor (610) having a transistor emitter connected to circuit ground, a transistor collector coupled to said pad (620), and a base; and a second N-channel-type metal-oxide-semiconductor transistor (612) having a transistor gate connected to said line (624) and a transistor channel connected between circuit ground and said first transistor (610) base.

9. An electrostatic-discharge-protection circuit (700) for protecting an integrated circuit, the protection circuit comprising in combination:

an integrated circuit pad (720);

an integrated circuit power supply line (716);

a first PNP-type bipolar transistor (710) having a transistor emitter connected to said line (716), a transistor collector coupled to said pad (720), and a base; and a second P-channel-type metal-oxide-semiconductor transistor (712) having a transistor gate connected to circuit ground and a transistor channel connected between said line (716) and said first transistor (710) gate.

* * * * *

UNITED STATES PATENT AND TRADEMARK OFFICE
CERTIFICATE OF CORRECTION

PATENT NO. : 5,086,365
DATED : February 4, 1992
INVENTOR(S) : Chuen-Der Lien

It is certified that error appears in the above-indentified patent and that said Letters Patent is hereby corrected as shown below:

Col. 7, line 43, delete "line" (first occurrence);

Col. 7, line 61, delete "line" (first occurrence).

Signed and Sealed this

Second Day of April, 1996

Attest:

BRUCE LEHMAN

Attesting Officer      Commissioner of Patents and Trademarks